US009863240B2

(12) United States Patent
Geehan et al.

(10) Patent No.: US 9,863,240 B2
(45) Date of Patent: Jan. 9, 2018

(54) METHOD AND APPARATUS FOR DRILLING A PROBABILISTIC APPROACH

(75) Inventors: Thomas Geehan, Houston, TX (US); Quanxin Guo, Sugar Land, TX (US); Mario Zamora, Houston, TX (US)

(73) Assignee: M-I L.L.C., Houston, TX (US)

( * ) Notice: Subject to any disclaimer, the term of this patent is extended or adjusted under 35 U.S.C. 154(b) by 14 days.

(21) Appl. No.: 12/574,489

(22) Filed: Oct. 6, 2009

(65) Prior Publication Data

US 2010/0088078 A1    Apr. 8, 2010

Related U.S. Application Data

(63) Continuation-in-part of application No. 12/051,676, filed on Mar. 19, 2008, now Pat. No. 7,890,307,
(Continued)

(51) Int. Cl.
*E21B 49/00*      (2006.01)
*E21B 43/267*     (2006.01)
(Continued)

(52) U.S. Cl.
CPC .......... *E21B 49/006* (2013.01); *E21B 21/003* (2013.01); *E21B 43/26* (2013.01);
(Continued)

(58) Field of Classification Search
CPC ...... E21B 43/267; E21B 21/003; E21B 44/00; E21B 47/06; E21B 43/26; C09K 8/80; C09K 8/62; G01V 11/00; G01V 1/282; G01V 2210/66; G01V 2210/667; G01V 17/5009
(Continued)

(56) References Cited

U.S. PATENT DOCUMENTS 3,818,990 A * 6/1974 Coulter ...................... 166/280.1
4,488,599 A * 12/1984 Graham et al. ............... 166/281
(Continued)

FOREIGN PATENT DOCUMENTS

WO    2009018536 A2    2/2009

OTHER PUBLICATIONS

SPE Article "Surface Tiltmeter Fracture Mapping Reaches New Depths—10,000 feet and Beyond?" by C.A. Wright et al, 1998, pp. 135-146.*
(Continued)

*Primary Examiner* — Akash Saxena
(74) *Attorney, Agent, or Firm* — David J. Smith (57) ABSTRACT

Methods and software tools for determining wellbore-strengthening information for a drilling operation, the method including inputting wellbore parameters into a wellbore simulator, importing wellbore-strengthening options into the wellbore simulator, and performing a plurality of wellbore simulations to obtain fracture information, wherein the performing the plurality of wellbore simulations includes selecting at least one of the wellbore parameters and determining the affect of the selected wellbore parameter on the wellbore. The method further includes selecting a wellbore-strengthening option based on the fracture information and outputting the selected wellbore-strengthening option.

14 Claims, 3 Drawing Sheets

Related U.S. Application Data which is a continuation of application No. 10/797,961, filed on Mar. 11, 2004, now Pat. No. 7,440,876.

(51) Int. Cl.
| | |
|---|---|
| *E21B 47/06* | (2012.01) |
| *E21B 21/00* | (2006.01) |
| *G06F 17/50* | (2006.01) |
| *E21B 43/26* | (2006.01) |
| *C09K 8/80* | (2006.01) |
| *C09K 8/62* | (2006.01) |
| *E21B 44/00* | (2006.01) |

(52) U.S. Cl.
CPC ............ *G06F 17/5009* (2013.01); *C09K 8/62* (2013.01); *C09K 8/80* (2013.01); *E21B 43/267* (2013.01); *E21B 44/00* (2013.01); *E21B 47/06* (2013.01); *G01V 2210/66* (2013.01); *G01V 2210/667* (2013.01)

(58) Field of Classification Search
USPC ..................... 703/9, 10; 166/250.1
See application file for complete search history.

(56) References Cited

U.S. PATENT DOCUMENTS

| | | | | |
|---|---|---|---|---|
| 4,522,731 | A * | 6/1985 | Lunghofer | 507/269 |
| 4,531,188 | A * | 7/1985 | Poupon | E21B 49/00 702/12 |
| 4,802,144 | A * | 1/1989 | Holzhausen | E21B 43/26 181/105 |
| 4,828,028 | A * | 5/1989 | Soliman | 166/250.1 |
| 4,848,461 | A * | 7/1989 | Lee | E21B 43/26 166/250.1 |
| 5,207,282 | A * | 5/1993 | Fuh et al. | 175/72 |
| 5,243,521 | A * | 9/1993 | Luthi | G01V 3/20 702/11 |
| 5,413,179 | A * | 5/1995 | Scott, III | 166/308.1 |
| 5,503,225 | A | 4/1996 | Withers | |
| 6,002,985 | A * | 12/1999 | Stephenson | E21B 43/00 702/13 |
| 6,439,309 | B1 | 8/2002 | Matherly et al. | 166/276 |
| 6,693,277 | B2 * | 2/2004 | Cowan et al. | 250/303 |
| 6,826,486 | B1 * | 11/2004 | Malinverno | 702/16 |
| 6,876,959 | B1 | 4/2005 | Peirce et al. | |
| 6,904,365 | B2 * | 6/2005 | Bratton et al. | 702/9 |
| 7,111,681 | B2 * | 9/2006 | Detournay | E21B 43/26 166/250.1 |
| 7,248,969 | B2 * | 7/2007 | Patzek et al. | 702/13 |
| 7,278,485 | B2 * | 10/2007 | Kirsner et al. | 166/305.1 |
| 7,431,106 | B2 * | 10/2008 | Alberty et al. | 175/72 |
| 7,451,812 | B2 * | 11/2008 | Cooper et al. | 166/250.1 |
| 7,499,846 | B2 * | 3/2009 | Massingill et al. | 703/10 |
| 7,660,673 | B2 * | 2/2010 | Dozier | 703/10 |
| 7,933,718 | B2 * | 4/2011 | McDaniel et al. | 702/11 |
| 7,950,472 | B2 * | 5/2011 | DiFoggio et al. | 175/38 |
| 8,290,711 | B2 * | 10/2012 | Barthelemy et al. | 702/6 |
| 2002/0013687 | A1 * | 1/2002 | Ortoleva | 703/10 |
| 2002/0112886 | A1 | 8/2002 | Ward | |
| 2003/0050758 | A1 * | 3/2003 | Soliman | E21B 43/26 702/6 |
| 2003/0139916 | A1 * | 7/2003 | Choe et al. | 703/10 |
| 2003/0168257 | A1 * | 9/2003 | Aldred et al. | 175/24 |
| 2003/0174581 | A1 * | 9/2003 | Parra | G01V 1/44 367/56 |
| 2005/0028979 | A1 * | 2/2005 | Brannon et al. | 166/280.2 |
| 2005/0203723 | A1 * | 9/2005 | Geehan et al. | 703/6 |
| 2005/0274510 | A1 * | 12/2005 | Nguyen et al. | 166/250.12 |
| 2005/0279495 | A1 | 12/2005 | Chen et al. | |
| 2006/0065398 | A1 * | 3/2006 | Brannon et al. | 166/280.2 |
| 2006/0219402 | A1 * | 10/2006 | Lecampion | 166/250.1 |
| 2006/0254826 | A1 * | 11/2006 | Alberthy | 175/72 |
| 2007/0007006 | A1 * | 1/2007 | Massingill et al. | 166/250.15 |
| 2007/0294034 | A1 * | 12/2007 | Bratton | E21B 41/00 702/6 |
| 2008/0091396 | A1 * | 4/2008 | Kennon et al. | 703/10 |
| 2008/0093073 | A1 * | 4/2008 | Bustos | C09K 8/68 166/279 |
| 2008/0113879 | A1 * | 5/2008 | Way et al. | 507/117 |
| 2008/0133193 | A1 | 6/2008 | Gdanski et al. | |
| 2008/0149329 | A1 * | 6/2008 | Cooper et al. | 166/250.01 |
| 2008/0162094 | A1 | 7/2008 | Geehan et al. | |
| 2008/0209997 | A1 * | 9/2008 | Bailey | E21B 43/26 73/152.02 |
| 2009/0029878 | A1 * | 1/2009 | Bicerano | 507/107 |
| 2009/0090504 | A1 * | 4/2009 | Weightman | E21B 43/26 166/250.01 |
| 2009/0090505 | A1 * | 4/2009 | McDaniel et al. | 166/250.1 |
| 2009/0119082 | A1 * | 5/2009 | Fitzpatrick | E21B 49/00 703/10 |
| 2009/0125238 | A1 * | 5/2009 | Barboza et al. | 702/11 |
| 2009/0132458 | A1 | 5/2009 | Edwards et al. | |
| 2009/0188718 | A1 * | 7/2009 | Kaageson-Loe et al. | 175/40 |
| 2009/0205825 | A1 * | 8/2009 | Smith, Jr. | E21B 43/26 166/280.1 |
| 2009/0210161 | A1 * | 8/2009 | Duenckel | G01V 5/101 702/8 |
| 2010/0088078 | A1 * | 4/2010 | Geehan et al. | 703/2 |
| 2010/0139387 | A1 * | 6/2010 | Jamison et al. | 73/152.25 |
| 2010/0181073 | A1 * | 7/2010 | Dupriest et al. | 166/308.1 |
| 2010/0250204 | A1 * | 9/2010 | Leonard et al. | 703/2 |
| 2011/0001040 | A1 * | 1/2011 | Smith et al. | 250/264 |
| 2011/0077918 | A1 * | 3/2011 | Mutlu et al. | 703/6 |
| 2011/0257944 | A1 * | 10/2011 | Du et al. | 703/2 |
| 2013/0143777 | A1 * | 6/2013 | Wang | 507/204 |
| 2013/0306315 | A1 * | 11/2013 | Kaminsky et al. | 166/280.1 |
| 2014/0067353 | A1 * | 3/2014 | Shelley | E21B 43/26 703/10 |

OTHER PUBLICATIONS

SPE Article "Downhole Tiltmeter Fracture Mapping: Finally Measuring Hydraulic Fracture Dimensions" by C.A. Wright et al, 1998, pp. 1-15.*

"Wellbore stability analysis in porous carbonate rocks using cap models" L.C. Coelho e tal, WIT Press, ISBN 1-85312-707-8, pp. 265-274.*

SPE article "A Physical Model for Stress Cages" by Mark W. Alberty et al (Publication Date Sep. 26-29, 2004; pp. 1-8).*

"The stress-strain behaviour of rock material related to fracture under compression" by Chunlin Li et al.; Engineering Geology 49 (1998) pp. 293-302.*

Uncertainty Assessment in Well Productivity Loss due to Formation Damage; Y. Ding et al; Petroleum Society Canadian Institute of Mining, Metallurgy & Petroleum Paper 2005-024 (Year 2005), pp. 1-14.*

What Is Sensitivity Analysis?—MATLAB & Simulink; http://www.mathworks.com/help/sldo/ug/what-is-sensitivity-analysis.html?s_tid=gn_loc_drop, Feb. 3, 2016, pp. 2 of 2.*

Office Action issued in U.S. Appl. No. 12/051,676 dated May 25, 2010 (16 pages).

Office Action issued in related Columbian Application No. 06-95.216 dated Apr. 16, 2010 (10 pages) Including evidence of Issuance date of the Office Action.

Second Office Action issued in corresponding Chinese Patent Application No. 200580007715.9 with English translation; Dated Oct. 19, 2010 (9 pages).

International Search Report and Written Opinion issued in corresponding International Application No. PCT/US2010/051596; Dated Jun. 14, 2011 (8 pages).

Notice of Allowance issued in related U.S. Appl. No. 12/051,676; Dated Oct. 5, 2010 (8 pages).

Office Action issued in corresponding Chinese Application No. 200580007715.9; Dated Dec. 16, 2011 (6 pages).

Official Action issued in corresponding Norwegian Application No. 20064019; Dated Jan. 28, 2012 (6 pages).

(56) References Cited

OTHER PUBLICATIONS

Keck, R.G. "Drill Cutting Injection: A Review of Major Operations and Technical Issues", Society of Petroleum Engineers, SPE 77553, Oct. 2, 2002 (12 pages).
Examination Report issued in the corresponding Application No. GCC/P/2005/4612; Dated Feb. 21, 2012 (6 pages).
Novelty Search Report issued in the corresponding Application No. GCC/P/2005/4612; Dated Mar. 22, 2012 (3 pages).
Minton, R.C., "Downhole Injection of OBM Cuttings Economical in North Sea", Oil & Gas Journal, May 30, 1994 (May 30, 1994), vol. 92, No. 22, pp. 75-79.
Official Action issued in corresponding Thai Application No. 0501001046 with English translation dated Jun. 3, 2014 (4 pages).
Clifton, et al., "Multiple Fluids, Proppant Transport, and Thermal Effects in Three-Dimensional Simulation of Hydraulic Fracturing", Oct. 2-5, 1988, SPE 18198, 14 pages.
Clifton, et al., "Modeling of In-Situ Stress Change Due to Cold Fluid Injection", May 29-31, 1991, SPE 22107, 13 pages.
Canadian Office Action for corresponding Canadian Application No. 2,776,858 date Mar. 2, 2016, 4 pages.

\* cited by examiner

METHOD AND APPARATUS FOR DRILLING A PROBABILISTIC APPROACH

CROSS-REFERENCE TO RELATED APPLICATIONS

This application is a continuation in part of U.S. patent application Ser. No. 12/051,676 filed Mar. 19, 2008, which is a continuation of U.S. patent application Ser. No. 10/797,961 filed Mar. 11, 2004, and claims the benefit, pursuant to 35 U.S.C. §120, of these applications. Both applications are incorporated by reference in their entirety.

BACKGROUND

Field of the Disclosure

Embodiments disclosed herein relate to systems and methods for strengthening wellbores during drilling. More specifically, embodiments disclosed herein relate to systems and methods using a probabilistic approach for strengthening wellbores. More specifically still, embodiments disclosed herein relate to systems and methods using probabilistic approaches based on Monte Carlo for simulating and determining options during wellbore-strengthening operations.

Background Art

Lost circulation is a recurring drilling problem, characterized by loss of drilling mud into downhole formations that are fractured, highly permeable, porous, cavernous, or vugular. These earth formations can include shale, sands, gravel, shell beds, reef deposits, limestone, dolomite, and chalk, among others. Other problems encountered while drilling and producing oil and gas wells include stuck pipe, hole collapse, loss of well control, resulting in loss of or decreased production.

Induced mud losses may also occur when the mud weight, required for well control and to maintain a stable wellbore, exceeds the fracture resistance of the formations. A particularly challenging situation arises in depleted reservoirs, in which the reduction in pore pressure weakens the effective strength of the hydrocarbon-bearing rocks, but neighboring or inter-bedded low permeability rocks, such as shales, maintain their pore pressure. This can make the drilling of certain depleted zones difficult or impossible because the mud weight required to support the shale exceeds the reduced fracture resistance of the depleted formations.

Currently, several wellbore-strengthening methods are used to reduce the incidence of lost circulation during drilling. Wellbore strengthening refers to creating and filling small fractures with loss-prevention materials (LPM) to alter the near-wellbore hoop stress, thereby increasing the fracture resistance above the in-situ minimum horizontal stress. One such technique is plugging an existing or drilling-induced fracture at the fracture tip. Another method may include plugging a fracture at the wellbore wall, also known in the art as "stress-cage."

Methods of modeling lost circulation, and thus methods of modeling and formulating mechanisms to prevent or stop lost circulation typically use a deterministic approach. More specifically, for a given set of inputs, there is only one possible result from the fracturing/lost circulation simulation. For example, modeling the formation may provide information about whether a given lost circulation solution will effectively prevent lost circulation. Current methods of determining whether particular solutions effectively prevent lost circulation are limited by the number of variables and formation properties that may be considered.

Accordingly, there exists a need for systems and methods of more effectively modeling lost circulation loss and developing solutions for lost circulation during drilling.

SUMMARY

In general, in one aspect, embodiments disclosed herein relate to a method of determining wellbore-strengthening information for a drilling operation, the method including inputting wellbore parameters into a wellbore simulator, importing wellbore-strengthening options into the wellbore simulator, and performing a plurality of wellbore simulations to obtain fracture information, wherein the performing the plurality of wellbore simulations includes selecting at least one of the wellbore parameters and determining the affect of the selected wellbore parameter on the wellbore. The method further includes selecting a wellbore-strengthening option based on the fracture information and outputting the selected wellbore-strengthening option.

In another aspect, embodiments disclosed herein relate to a software tool for determining a wellbore-strengthening option, the software tool including instructions to characterize fractures in a wellbore based on inputted wellbore parameters, perform a wellbore simulation to determine an affect of at least one wellbore parameter on the wellbore, generate fracture information based on the wellbore simulation, and provide a wellbore-strengthening option based on the generated fracture information.

Other aspects of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In general, embodiments disclosed herein relate to systems and methods for determining solutions for lost circulation, as well as methods for wellbore strengthening during drilling. Such systems and methods may include software packages capable of modeling wells with three-dimensional stress anisotropy, as well as a probabilistic approach based on, for example, Monte Carlo simulation. Such systems and methods may thereby decrease data uncertainties of existing models, thereby providing more effective risk assessment and evaluation of available options for preventing lost circulation and providing wellbore-strengthening options.

The process of wellbore strengthening, as explained above, includes creating and filling small fractures with loss-prevention materials (LPM) to alter the near-wellbore hoop stress, thereby increasing the fracture resistance above the in-situ minimum horizontal stress. Such actions may increase the apparent breakdown gradient limit of the wellbore by as much as 3 to 4 pounds per gallon. A number of different properties may influence wellbore strengthening, such as, for example, wellbore diameter, well orientation, in-situ stress magnitude and orientation, lithological properties, and the range of particle size, distribution, and concentration of LPMs. Thus, in order to effectively plan for a wellbore-strengthening operation, specific properties of the wellbore, as well as properties of the well treatment, must be considered.

Systems and methods disclosed herein may thus provide software tools for evaluating wellbores and wellbore treatment plans to provide increased success in wellbore-strengthening operations. Such software tools may include modules to estimate potential fracture size for a particular wellbore and determine the appropriate blending of granular LPMs. Solutions developed by embodiments of the present disclosure may thereby use such modules to provide a closed-form solution for fracture aperture prediction, thereby allowing for Monte Carlo simulations to complete more than 10,000 simulations in a few seconds. The robust nature of the simulation may also allow customized solutions for wellbore strengthening to be developed for particular wellbores.

Initially, embodiments of the present application may provide for the prediction of a particular fracture size and aperture for a wellbore of a particular deviation and orientation under specific anisotropic stress conditions. The closed-form solution for fracture aperture may be based on linear fracture mechanics. As such, the model may depend on wellbore parameters, such as deviation and orientation, fracture length, wellbore radius, in-situ stress, bottomhole pressure, and rock elastic properties. Such models may also assume that when multiple fracture lengths are larger than the radius of the wellbore, the wellbore and the fractures may be regarded as a single fracture with a length equal to double the length of the fracture plus the radius of the wellbore. Similarly, when the fracture length is smaller than the radius of the wellbore, each fracture may be regarded as an "edge crack" in a half plane. Table 1, below, compares exemplary closed-form solutions to finite element analysis for a fracture aperture at the wellbore face.

TABLE 1

Comparison of Finite Element Analysis and
Closed-Form Solutions (R = 6 inches)

| | L = 6 inches | L = 9 inches | L = 12 inches |
|---|---|---|---|
| FEA solution (mm) | 0.1702 | 0.2332 | 0.2921 |
| Closed form solution (mm) | 0.1703 | 0.2342 | 0.2936 |
| Relative error (%) | −0.071% | −0.472% | −0.541% |

For the closed-form solution of Table 1, the following parameters were used: Pw=9200 psi, Sh=9000 psi, Young's modulus $E=1.09\times10^6$ psi, and Poisson's ratio v=0.225, wherein Pw is the pressure in the wellbore at the depth of the fracture, Sh is the in-situ stresses, L is the fracture length, and R is the radius of the wellbore. Based on the above results, the required inputs for fracture aperture are uncertain. The uncertainties may occur as a result of logging and testing analysis of offset wells, geology such as rock elastic properties, and bottomhole pressures.

The results of the above analysis demonstrate that the closed form solution compares with relatively small error to numerical results obtained through finite element analysis (FEA). As such, probabilistic models for fracture width prediction may be used according to embodiments of the present disclosure. In one embodiment, the probabilistic approach includes using Monte Carlo simulation methodologies.

Monte Carlo simulation methodologies provide a computational method that repeatedly calculates results based on random samplings across the defined range of the input variables. As such, Monte Carlo simulation methodologies may provide a broad spectrum of possible outcomes allowing for inputs to be ranked according to their relative affect on outputs, otherwise known as sensitivity analysis. Each input with a particular uncertainty as to the exact value may be quantified by transforming the input into a statistical distribution that relates to a possible range and distribution of values. The simulation methodology may then statistically sample the input distributions, process each collection of samples deterministically, and repeat the process until a range of approximate solutions is determined. Each output in the solution may be displayed in the form of a distribution depicting the likeliness of a specific outcome. Those of ordinary skill in the art will appreciate that by increasing the number of samplings, a closer approximation may be determined.

Embodiments of the present disclosure may thereby provide simulations that allow for several thousands of iterations to be performed. The simulation may sample multiple distributions, perform fracture-width calculations, as described above, and generate a fracture width distribution. The simulator may then determine a probability of risk of a particular result for specific fracture apertures.

To further explain how such a simulation may provide wellbore-strengthening options for a drilling operation, an exemplary wellbore simulation is provided below. Initially, in determining wellbore-strengthening information, a user, such as a drilling engineer, may input select wellbore parameters into a wellbore simulator. Examples of wellbore parameters that the user may input include, for example, minimum horizontal stress, maximum horizontal stress, stress orientation, bottomhole pressure, Young's modulus, Poisson's ratio, wellbore diameter, expected fracture lengths, etc. Additional wellbore parameters may also be entered, if known, to further increase the accuracy of the wellbore simulation.

In certain embodiments, inputting the wellbore parameters may further include defining a distribution of values for each parameter. One such distribution is based on a maximum wellbore parameter value, s a minimum wellbore parameter value, and a most-likely wellbore parameter value. Additionally, depending on the wellbore parameter distribution, the user may choose only to input particular wellbore parameters and/or remove particular wellbore parameters from being used in the simulation.

After wellbore parameters are input into the wellbore simulator, a user may import wellbore-strengthening options. As used herein, importing wellbore-strengthening options may include providing particular wellbore-strengthening options to be evaluated, or may include allowing the wellbore simulator to access a database of wellbore-strengthening options, whether the database is stored locally or remotely from the wellbore simulator. Wellbore-strengthening options may include, for example, LPMs and/or LPM blends, and may include commercially available LPMs and LPM blends and/or custom solutions.

With wellbore parameters and wellbore-strengthening options available, the wellbore simulator may then perform a plurality of wellbore simulations to obtain fracture information. The wellbore simulations may include selecting one or more wellbore parameters and determining the affect of the selected wellbore parameter(s) on the wellbore. For example, the selected wellbore parameter may be iteratively simulated to determine the affect of the parameter on fractures in the wellbore. The simulation may further include randomly sampling the selected wellbore parameter, thereby allowing the parameter to be quantified by transforming the parameter into a statistical distribution that relates to the possible range and distribution of values. The simulator then statistically samples the selected wellbore parameter, processes each collection of samples deterministically, and repeats the process until it produces an approximate solution. The wellbore simulator may then output the approximate solution in the form of, for example, a distribution depicting the likeliness of a specific outcome. The output may be in the form of probabilistic values and/or ranges, such as P10, P50, and P90.

The wellbore simulator may also perform fracture-width calculations and generate a fracture width distribution. The fracture-width calculations and fracture-width distributions may then be used to determine and output a probability or risk of a particular fracture aperture. This "uncertainty analysis" may thereby allow the probability of risk to be displayed as statistical outputs, whereby the simulator may determine a particular fracture width in terms of standard deviations, means, or likelihood within a range.

In addition to "uncertainty analysis," embodiments disclosed herein may also provide for a "sensitivity analysis." The simulator may allow the user to adjust aspects of the simulation, such as minimum, maximum, and most-likely wellbore parameter values, as well as adjust which parameters are simulated in order to rank particular wellbore parameters according to importance and/or relevance in determining variation in the outputs. The sensitivity may then be displayed to the user in terms of the percentage impact a particular wellbore parameter has relative to other simulated wellbore parameters. Because the order of importance of a particular wellbore parameter may be determined, a user may adjust simulated wellbore parameters, such as by adjusting the minimum, maximum, and/or most-likely wellbore parameter values to further refine the outputs.

After the wellbore simulation, the simulator has derived fracture information that may be used to select a wellbore-strengthening option. Because the fracture information may include probability of fracture widths in ranges (e.g., probabilistic values P10, P50, P90), the simulator may generate an optimum wellbore-strengthening solution for each range of fracture widths. For example, the choice of a particular LPM blend for probabilistic values P10 and P50 are a sub-set of the optimum blend P90. Thus, for each particular probabilistic value, the wellbore simulator may determine a particular LPM or blend of LPMs that will optimally plug the fracture having a particular fracture width. After such calculation, the wellbore simulator may then output the optimized wellbore-strengthening option (e.g., a particular LPM or LPM blend) to the user in the form of a graphical, textual, or other display.

To further assist the user in selecting a particular wellbore-strengthening option, the wellbore simulator may also assess the bridging quality of a particular LPM blend by calculating and displaying the range of fracture widths a particular blend will cover. Additionally, the wellbore simulator may determine a cumulative particle size distribution (PSD) for a wellbore-strengthening option that provides an effective sealing pressure for a particular fracture width distribution (e.g., P10, P50, P90). The wellbore simulator may further modulate PSDs and wellbore-strengthening options to allow for an objective comparison of concentration requirements for particular wellbore-strengthening options.

Additionally, the wellbore simulator may apply an inversion technique to calculate an approximate gain in net fracture pressure as a result of using a selected wellbore-strengthening option. The wellbore simulator may calculate such net fracture pressures for any or all of the fracture widths and/or fracture with ranges previously calculated. Such results may then be displayed to the user for use in selecting a wellbore-strengthening option.

Figure 1:
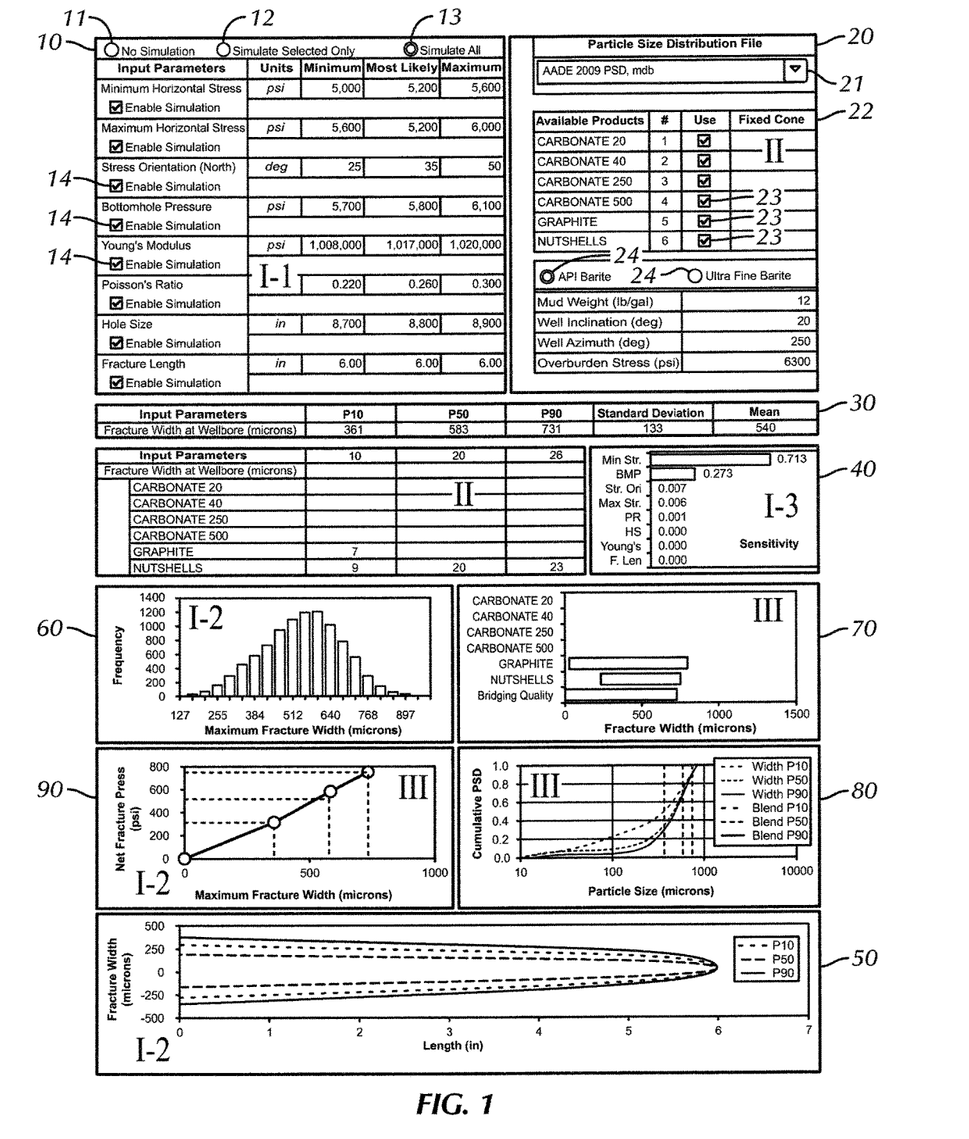
FIG. 1 shows a graphical user interface in accordance with one embodiment of the present disclosure.

Referring to FIG. 1, a graphical user interface according to embodiments of the present disclosure is shown. In this embodiment, the wellbore simulator described above requires certain inputs so that desired outputs may be calculated. The graphical user interface illustrated in FIG. 1 may be used to enter such inputs, as well as display calculated and determined information to a user.

Referring initially to wellbore parameter input box 10, a user may select various wellbore parameters for simulation. Those skilled in the art will also appreciate that defined values of the individual input parameters may have a particular distribution (e.g., normal, triangular, uniform, log-normal, etc.). The range of values and the distribution may be obtained from the knowledge database (108) (described below). Wellbore parameter input box 10 includes radio buttons 11, 12, and 13 that may allow a user to select whether to perform a simulation, to only simulate selected wellbore parameters, or to simulate all parameters. As illustrated, for this simulation, the simulate-all radio button 13 is selected, and as such, upon execution, the simulation uses the predefined input distributions for all wellbore parameters. The displayed input parameters include minimum horizontal stress, maximum horizontal stress, stress orientation, bottomhole pressure, Young's modulus, Poisson's ratio, wellbore diameter, and fracture length. However, those of skill in the art will appreciate that other wellbore parameters may be added, while certain parameters may be excluded, and still be within the scope of the present disclosure.

Wellbore parameter input box 10 also includes finable fields that may allow a user the define a minimum, most likely, and/or maximum value for each of the wellbore input parameters. Thus, for a particular simulation, the user may choose different minimum, most-likely, or maximum values for each of the wellbore parameters. Additionally, wellbore parameter input box 10 includes check boxes 14, which may allow the user to select specific wellbore parameters for simulation. As a result, in certain simulations, the user may deselect certain wellbore input parameters, such that the most-likely values for those input parameters are used deterministically. The graphical user interface also includes a wellbore-strengthening option box 20. Wellbore-strengthening option box 20 includes a drop down menu 21 that allows a user to select specific particle-size distribution (PSD) files. Upon selection of a particular PSD file, the wellbore-strengthening option box 20 will populate available products and/or blends of products in available product box 22. The user may then select specific products for use in the simulation by selected or deselecting check boxes 23. The user may also select various weight materials, via radio buttons 24. Other drilling/well information may also be selected/viewed, such as mud weights, well inclinations, well azimuths, overburden stresses, etc.

During simulation, as explained above, the wellbore simulator may provide an uncertainty analysis. The graphical user interface displays such uncertainty analysis results in uncertainty analysis box 30. Uncertainty analysis may be displayed by, for example, displaying the fracture width for a particular wellbore in terms of probabilistic values P10, P50, and P90. The standard deviation, as well as a mean fracture width may also be displayed. Those of ordinary skill in the art will appreciate that the probabilistic values and/or ranges may vary according to the requirements of particular drilling operations, but generally, P10, P50, and P90 may be used to allow for conservative P10, middle P50, and aggressive P90 options.

The uncertainty analysis may also result in a graphical fracture box 50. Graphical fracture box 50 may be used to illustrate the relative differences between fracture width at P10, P50, and P90 values graphically, rather than numerically. Such illustrations may be color coded, and allow a user to more readily see the differences between P10, P50, and P90 values. Uncertainty analysis may also allow for a display of the frequency of fracture of a particular width at frequency box 60. Such a graphical illustration may further help a user see the approximate fracture-size distribution and frequency of ranges of fracture widths relied on by the wellbore simulator.

Additionally, the wellbore simulator may provide a sensitivity analysis of the input parameters. The graphical user interface displays such sensitivity analysis in sensitivity analysis box 40. Sensitivity analysis box 40 displays the selected input wellbore parameters and provides a ranking according to relevance to the output, for each of the wellbore parameters. In this embodiment, the sensitivity analysis is displayed in both graphical form, as a bar graph, as well as numerical values. Those of ordinary skill in the art will appreciate that in certain embodiments, the values may also be color coded, provide a percentage breakdown, or otherwise display sensitivity analysis information.

The bridging quality of a selected wellbore-strengthening option, as well as approximated product coverage, are collectively illustrated in product blend box 70, cumulative PSD box 80, and net fracture pressure box 90. Product blend box 70 illustrates the bridging quality of a selected wellbore-strengthening option by displaying in bar graph form the fracture width plugged by specific LPMs. Cumulative PSD box 80 illustrates the effective sealing pressure for sample fracture-width distributions at P10, P50, and P90 values. The user may switch PSD files in wellbore-strengthening option box 20, as well as the options selected therein, to allow for an objective comparison of concentration requirements for various types of LPMs. Net fracture pressure box 90 illustrates the gain in net fracture pressure as a result of using a particular wellbore-strengthening option. Thus, a user can view the affect of a particular wellbore-strengthening option on the net fracture pressure when selecting a final wellbore-strengthening blend.

Those of ordinary skill in the art will appreciate that various other modules/boxes may be used to display information generated by wellbore simulators according to embodiments of the present disclosure. As such, in certain embodiments, additional information may be displayed and/or outputted, or may be displayed/outputted in forms not explicitly disclosed herein, and still be within the scope of the present disclosure.

Figure 2:
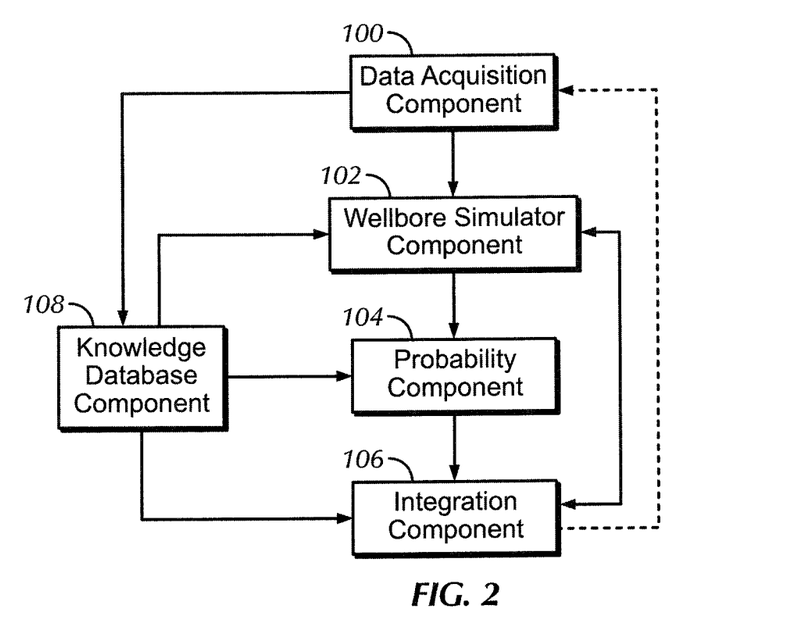
FIG. 2 shows a system in accordance with one embodiment of the present disclosure.

In order to more fully understand the wellbore simulator, and the transformation of data therewithin, FIG. 2 shows a system in accordance with one embodiment of the present disclosure. More specifically, FIG. 2 shows an embodiment detailing the various components within the system. As shown in FIG. 2, the system includes a data acquisition (DAQ) and evaluation component (100), a wellbore simulator component (102), a probability component (104), an integration component (106), and a knowledge database component (108). Each of the components is described below.

In one embodiment of the invention, the DAQ component (100) corresponds to both software (e.g., data evaluation software packages) and hardware components (e.g., down hole tools) that are used to gather site specific data (i.e., data about wellbore parameters). In one embodiment, the site specific data may include, but is not limited to, wellbore parameters obtained from logging information and well testing, as well as core tests, etc. The initial site specific data (i.e., data obtained prior to obtaining recommendations about additional site specific data to gather (discussed below)) may be used to generate a generic stratigraphy for the formation. Specifically, the initial site specific data provides information about the relevant zones (i.e., sand, shale, etc.) in the formation. The site specific data is used as an input for the wellbore simulator component (102). In addition, the DAQ component (100) also includes functionality (in the form of software components, hardware components, or both) to obtain additional site specific information after drilling has begun.

As noted above, the wellbore simulator component (102) receives the site specific data as input from the DAQ component (100). In addition, the wellbore simulator component (102) may include functionality to allow a user to input additional information about the drilling operation that is planned to occur at the site. In one embodiment, methodologies for determining realistic inputs for the aforementioned parameters are defined in the knowledge database (108) (described below). In certain embodiments, the knowledge database may include a repository of one or more of the following: site specific data, data about best practices, input parameter distributions, etc. The wellbore simulator component (102) may use the aforementioned information to simulate fractures in the wellbore.

The results generated from wellbore simulation may subsequently be used as input into the probability component (104). In one embodiment, the probability component (104) includes functionality to determine specific aspects of fractures in the formation. In one embodiment, the fractures may be evaluated on a per-zone basis. Further, in certain embodiments, probabilities associated with a particular zone may be determined using information from the knowledge database component (108) (described below).

The probability of affecting a fracture may then used as input into the integration component (106). In one embodiment of the invention, the integration component (106) includes functionality to determine wellbore-strengthening options. Wellbore-strengthening options may include, for example, a LPM or blend of LPMs that may plug fractures in the formation, thereby resulting in a relatively stronger wellbore with decreased lost circulation.

In certain embodiments, the wellbore-strengthening options may be determined using a Monte Carlo simulation methodology in conjunction with the probabilities obtained from the probability component (104) and wellbore simulator component (102). Specific aspects of the Monte Carlo simulation are discussed above, as well as discussed in U.S. patent application Ser. No. 12/051,676, incorporated in its entirely above.

Those skilled in the art will appreciate that the aforementioned components are logical components, i.e., logical groups of software and/or hardware components and tools that perform the aforementioned functionality. Further, those skilled in the art will appreciate that the individual software and/or hardware tools within the individual components are not necessarily connected to one another. In addition, while the interactions between the various components shown in FIG. 1 correspond to transferring information from one component to another component, there is no requirement that the individual components are physically connected to one another. Rather, data may be transferred from one component to another by having a user, for example, obtain a printout of data produced by one component and entering the relevant information into another component via an interface associated with that component. Further, no restrictions exist concerning the physical proximity of the given components within the system.

Figure 3:
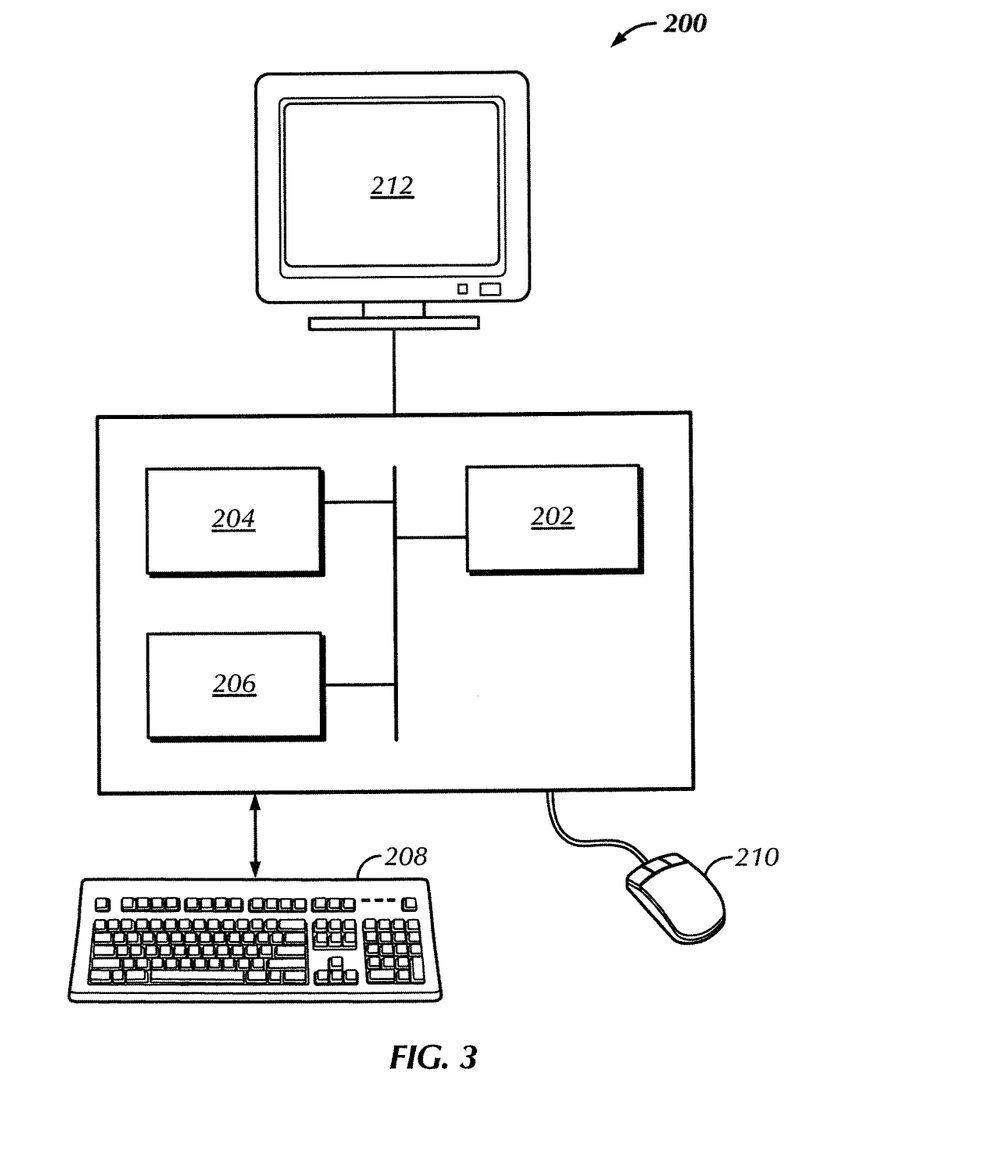
FIG. 3 shows a computer system in accordance with one embodiment of the present disclosure.

The present disclosure may be implemented on virtually any type of computer regardless of the platform being used. For example, as shown in FIG. 3, a networked computer system (200) includes a processor (202), associated memory (204), a storage device (206), and numerous other elements and functionalities typical of today's computers (not shown). The networked computer (200) may also include input means, such as a keyboard (208) and a mouse (210), and output means, such as a monitor (212). The networked computer system (200) is connected to a local area network (LAN) or a wide area network (e.g., the Internet) via a network interface connection (not shown). Those skilled in the art will appreciate that these input and output means may take other forms. Further, those skilled in the art will appreciate that one or more elements of the aforementioned computer (200) may be located at a remote location and connected to the other elements over a network or satellite.

Advantageously, embodiments of the present disclosure may provide methods and software tools for determining fracture widths in a probabilistic manner, thereby allow for the optimization of wellbore-strengthening options more quickly than with previous methods. Because methods of the present disclosure may allow thousands of iterations of a simulation to be performed in a short time period, the methods disclosed herein may also for faster modeling and LPM blend selections. The speed of such modeling may, in certain operations, allow for LPM blend selection to be achieved substantially in real time.

Also advantageously, embodiments of the present disclosure incorporate weight materials, such as barite, into the calculation, thereby allowing for a more accurate estimation of the effectiveness of a wellbore-strengthening operation in both weighted and non-weighted fluids. Additionally, embodiments of the present disclosure may advantageously allow for net fracture pressure to be determined, thereby providing a drilling engineer the ability to select an optimized wellbore-strengthening option for a particular drilling operation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method comprising:
   determining wellbore fracture information from a simulation that iteratively simulates wellbore parameters to determine an effect of the wellbore parameters on fractures in a wellbore wherein the wellbore parameters are selected from one or more of a group comprising: deviation, orientation, fracture length, wellbore radius, in-situ stress, bottom-hole pressure, and other rock elastic properties and further wherein the simulation selects one or more wellbore parameters to determine the effect of the wellbore parameters on the fractures by randomly sampling a selected wellbore parameter to quantify and transform the wellbore parameters into a statistical distribution and further wherein the simulation statistically samples the statistical distribution of the selected wellbore parameter and processes the samples deterministically to produce an approximate solution that is in the form of probabilistic values and/or ranges;
   ranking the selected parameter against at least one other parameter of the group according to a user-defined importance;
   determining an importance of the selected parameter relative to the at least one other parameter;
   adjusting the selected parameter depending on the user-defined importance;
   calculating a fracture width distribution based on the ranking and the effect of the wellbore parameters on the fractures in the wellbore wherein the fracture width distribution indicates a likelihood of encountering one or more fractures with a particular fracture width;
   simulating a plurality of loss-prevention material options for each fracture width in the fracture width distribution, calculating, by application of an inversion technique, at least one gain in net fracture pressure as a result of at least one loss-prevention material options of the plurality of loss-prevention material options, and outputting an approximate solution including at least a distribution of fracture information;
   selecting the optimum loss-prevention material option, from the simulated plurality of loss-prevention material options, for plugging at least one fracture having the particular fracture width; and
   outputting the selected optimum loss-prevention material option; and
   drilling a well using the selected optimum loss-prevention material option.

2. The method of claim 1, further comprising:
   obtaining a closed-form solution for the fracture width and performing fracture-aperture prediction performing an uncertainty analysis on the fracture information.

3. The method of claim 2, further comprising: displaying the uncertainty analysis to a user.

4. The method of claim 1, wherein the simulation is a Monte Carlo simulation.

5. The method of claim 1, wherein the wellbore parameter comprises at least one of the group consisting of minimum horizontal stress, maximum horizontal stress, stress orientation, bottomhole pressure, Young's modulus, Poisson's ratio, wellbore diameter, and fracture length.

6. The method of claim 1, further comprising:
   inputting wellbore parameters into a wellbore simulator;
   selecting a maximum wellbore parameter value;
   selecting a minimum wellbore parameter value; and
   selecting a most-likely wellbore parameter value.

7. The method of claim 1, wherein the simulation further comprises:
   performing a fracture-width calculation;
   generating a fracture-width distribution; and
   determining a probability for a fracture aperture.

8. The method of claim 1, wherein the selected optimum loss-prevention material option comprises a loss-prevention material blend.

9. The method of claim 8, wherein the loss-prevention material blend comprises at least one of sized synthetic graphite, calcium carbonate, and crushed nutshells.

10. The method of claim 8, wherein the loss-prevention material blend comprises oversized and undersized particles.

11. A method comprising:
inputting a plurality of parameters into a simulator operatively associated with a processor;
ranking each parameter of the plurality of parameters according to a user-defined importance;
determining a relevance of each parameter relative to other parameters of the plurality of parameters;
adjusting each parameter according to the determined relevance of each parameter;
importing information related to loss-prevention materials into the simulator;
performing a plurality of iterative simulations to obtain facture information regarding one or more fractures in a wellbore wherein the plurality of iterative simulations comprise:
  selecting at least one parameter from the plurality of parameters;
  accessing a database comprising the information related to the loss-prevention materials;
  determining an effect of the selected at least one parameter on the wellbore;
  retrieving a representative sample from the plurality of parameters by randomly sampling the selected at least one parameter such that the selected at least one parameter is quantified by transforming the selected at least one parameter into a statistical distribution relating to a range and distribution of values and by statistically sampling the selected at least one parameter;
  processing, deterministically, the representative sample;
  producing an approximate solution by at least once repeating the retrieving and the processing; and
  performing an uncertainty analysis comprising a fracture-width calculation to generate a fracture-width distribution, wherein a probability of risk of incurring a fracture of the one or more fractures in the wellbore with a particular width is determined based on the generated fracture-width distribution, wherein the probability of risk is displayable as a statistical output in one or more ranges of probabilistic values, wherein the plurality of iterative simulations generates an optimum strengthening solution for each of the one or more ranges of probabilistic values;
deriving wellbore fracture information comprising (a) the probability of risk of incurring a fracture of the one or more factures in the wellbore with a particular width in the one or more ranges of probabilistic values and (b) a gain in net fracture pressure, calculated by an inversion technique, as a result of a loss-prevention material or blend of loss-prevention materials; and
selecting an optimal loss-prevention material or blend of loss-prevention materials from the database based on the derived wellbore fracture information;
outputting the selected optimal loss-prevention material or blend of loss-prevention materials; and
drilling a well using the selected optimum loss-prevention material or blend of loss-prevention materials.

12. A non-transitory computer readable medium comprising a computer program, which when executed by a processor performs a method, the method comprising:
characterizing fractures in a wellbore based on wellbore parameters input by a user;
prioritizing the wellbore parameters by the computer program according, to an importance defined by the user, to assigned a rank to at least one wellbore parameter;
performing a simulation where the wellbore parameters are iteratively simulated by the assigned rank to determine an effect of one or more wellbore parameters on fractures in a wellbore and an effect of at least one wellbore parameter on the wellbore;
adjusting the wellbore parameter depending on the importance defined by the user;
generating fracture width information based on the ion, wherein the fracture width information includes a prediction of encountering a fracture with a particular width and further, wherein the simulation calculates at least one net fracture pressure by applying an inversion technique to calculate an approximate gain in net fracture pressure as a result of a wellbore-strengthening option;
selecting an optimum wellbore-strengthening option based on at least one selected from the generated fracture width information and the calculated at least one net fracture pressure; and
drilling a well using the selected optimum wellbore-strengthening option.

13. The non-transitory computer readable medium of claim 12, further comprising:
rendering a graphical user interface in response to a selection by a user of the wellbore parameters wherein the graphical user interface allows the user to input information to the software tool.

14. The non-transitory computer readable medium of claim 13, further comprising:
displaying fluid loss-prevention material on the graphical user interface;
allowing the user to adjust one or more of the wellbore parameters; and
repeating the simulation until a desired fluid loss-prevention material associated with the wellbore-strengthening option is displayed.

* * * * *